United States Patent
Fischer et al.

(10) Patent No.: US 8,154,081 B2
(45) Date of Patent: Apr. 10, 2012

(54) PROCESSES AND APPARATUS HAVING A SEMICONDUCTOR FIN

(75) Inventors: Mark Fischer, Boise, ID (US); T. Earl Allen, Kuna, ID (US); H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/017,854

(22) Filed: Jan. 31, 2011

(65) Prior Publication Data

US 2011/0121392 A1 May 26, 2011

Related U.S. Application Data

(63) Continuation of application No. 11/591,627, filed on Nov. 1, 2006, now Pat. No. 7,880,232.

(51) Int. Cl.
*H01L 27/12* (2006.01)

(52) U.S. Cl. ............. 257/347; 257/353; 257/E27.212; 257/E29.264; 257/E29.275

(58) Field of Classification Search .......... 257/347, 257/353, E29.264, E29.275, E27.112
See application file for complete search history.

(56) References Cited

U.S. PATENT DOCUMENTS

| 6,967,140 | B2 | 11/2005 | Doyle |
| 7,880,232 | B2 | 2/2011 | Fischer et al. |
| 2002/0179970 | A1 | 12/2002 | Yagishita et al. |
| 2003/0190766 | A1 | 10/2003 | Gonzalez et al. |
| 2005/0035391 | A1 | 2/2005 | Lee et al. |
| 2005/0106811 | A1* | 5/2005 | Forbes ................ 438/257 |
| 2005/0199942 | A1 | 9/2005 | Hofmann et al. |
| 2006/0046452 | A1* | 3/2006 | Rios et al. ........... 438/595 |
| 2007/0034922 | A1 | 2/2007 | Bhattacharyya |
| 2008/0102570 | A1 | 5/2008 | Fischer et al. |

* cited by examiner

*Primary Examiner* — Mary Wilczewski
*Assistant Examiner* — Toniae Thomas
(74) *Attorney, Agent, or Firm* — Schwegman, Lundberg & Woessner, P.A.

(57) ABSTRACT

A process may include first etching a trench isolation dielectric through a dielectric hard mask that abuts the sidewall of a fin semiconductor. The first etch can be carried out to expose at least a portion of the sidewall, causing the dielectric hard mask to recede to a greater degree in the lateral direction than the vertical direction. The process may include second etching the fin semiconductor to achieve a thinned semiconductor fin, which has receded beneath the shadow of the laterally receded hard mask. The thinned semiconductor fin may have a characteristic dimension that can exceed photolithography limits. Electronic devices may include the thinned semiconductor fin as part of a field effect transistor.

20 Claims, 11 Drawing Sheets

US 8,154,081 B2

PROCESSES AND APPARATUS HAVING A SEMICONDUCTOR FIN

PRIORITY APPLICATION

This application is a continuation of U.S. application Ser. No. 11/591,627, filed Nov. 1, 2006, now U.S. Pat. No. 7,880,232, which is incorporated herein by reference in its entirety.

TECHNICAL FIELD

This disclosure relates generally to semiconductor devices, including fin field emission transistors (FinFETs).

BACKGROUND

Miniaturization of microelectronic devices includes crowding more functionality, such as transistors, onto smaller areas of a semiconductive substrate. Some product goals include lower power consumption, higher performance, and smaller sizes. However, the continuous miniaturization of metal-oxide-semiconductor field effect transistor (MOSFET) devices causes problems in the conventional transistor structures.

Some designs proposed to address the problems of miniaturization use transistors with ultra-thin bodies, or transistors where the surface space charge region scales as other transistor dimensions scale down. Dual-gated or double-gated transistor structures also have been proposed to scale down transistors. As commonly used in the industry, "dual-gate" refers to a transistor with a front gate and a back gate which can be driven with separate and independent voltages, and "double-gated" refers to structures where both gates are driven with the same potential. An example of a double-gated device structure is the FinFET. "TriGate" structures and surrounding gate structures have also been proposed. In the TriGate structure, the gate is on three sides of the channel. In the surrounding gate structure, the gate surrounds or encircles the transistor channel. The surrounding gate structure provides desirable control over the transistor channel, but the structure has been difficult to realize in practice.

BRIEF DESCRIPTION OF THE DRAWINGS

The abovementioned issues are addressed by the present disclosure and will be understood by reading and studying the following specification, of which the Figures are a part.

DETAILED DESCRIPTION

Figure 1A:
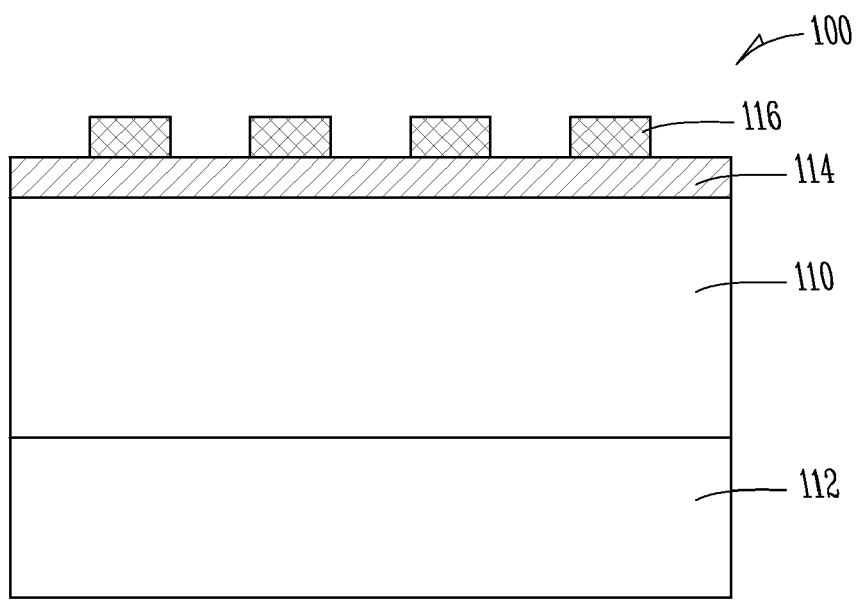
FIG. 1A is a cross-section elevation of a semiconductor device during processing according to an embodiment of the invention.

FIG. 1A is a cross-section elevation of a semiconductor device 100 during processing according to an embodiment. In some embodiments of the invention, the semiconductive substrate 110 comprises a bulk semiconductor that is derived from a semiconductor wafer. In an embodiment, the semiconductive substrate 110 comprises monocrystalline silicon such as wafer-level or epitaxial-level silicon. In an embodiment, the semiconductive substrate 110 may be disposed upon an insulator 112 such as silicon-on-insulator (SOI). The semiconductor device 100 is being fabricated into a transistor-bearing structure such as a flash memory device. In an embodiment, a flash memory device such as a not-and (NAND) logic flash memory device is being fabricated.

A dielectric pre-mask layer 114 may be disposed upon the semiconductive substrate 110. In an embodiment, the dielectric pre-mask layer 114 comprises a nitride hard mask such as silicon nitride, $Si_xN_y$. Other hard-mask layers can be used according to a given application. The dielectric pre-mask layer 114 may be patterned with a mask 116 such as a photoresist material.

Figure 1B:
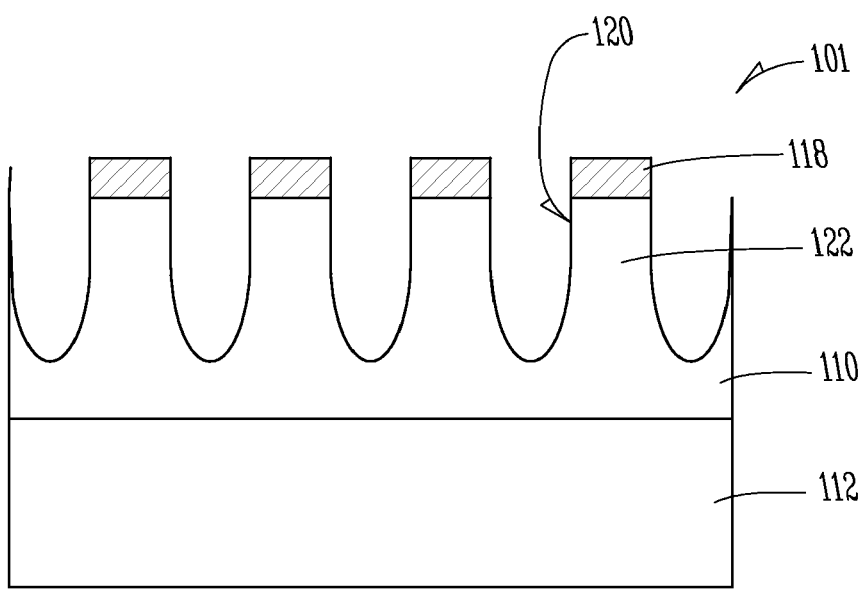
FIG. 1B illustrates the semiconductor device depicted in FIG. 1A during further processing according to an embodiment of the invention.

FIG. 1B illustrates the semiconductor device depicted in FIG. 1A during further processing according to an embodiment. The semiconductor device 101 has been etched to pattern the dielectric pre-mask layer 114 that is depicted in FIG. 1A. The patterned dielectric mask 118 may be formed as a portion of the remainder of the dielectric pre-mask layer 114. A first recess 120 has been formed in the semiconductive substrate 110 as a result of the etch through the dielectric pre-mask layer 114. Consequently, a semiconductor fin 122 may be been defined by the etch into the semiconductive substrate 110.

Figure 1C:
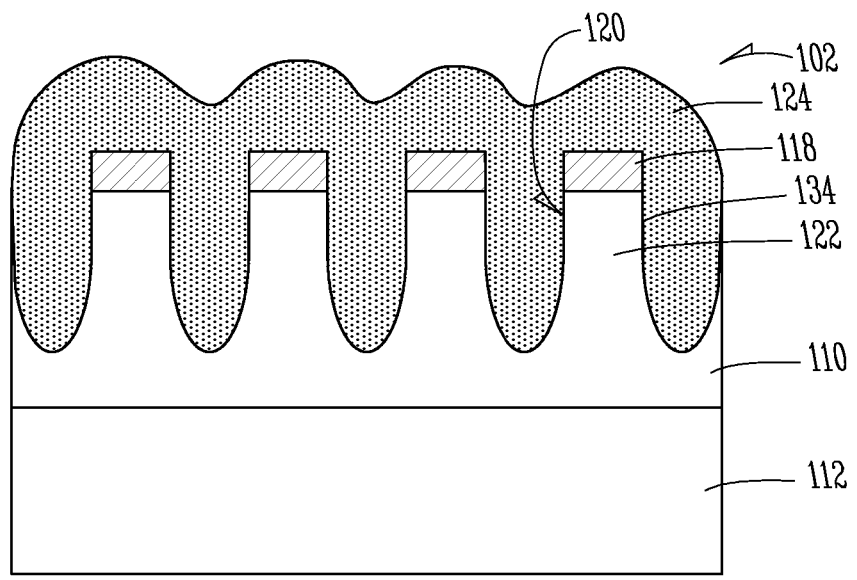
FIG. 1C illustrates the semiconductor device depicted in FIG. 1B during further processing according to an embodiment of the invention.

FIG. 1C illustrates the semiconductor device depicted in FIG. 1B during further processing according to an embodiment. The semiconductor device 102 has been processed with a blanket dielectric formation. A blanket dielectric 124 has been formed over the semiconductive substrate 110 and has been filled into the first recess 120 such that the sidewall 134 of the semiconductor fin 122 abuts the blanket dielectric 124.

Figure 1D:
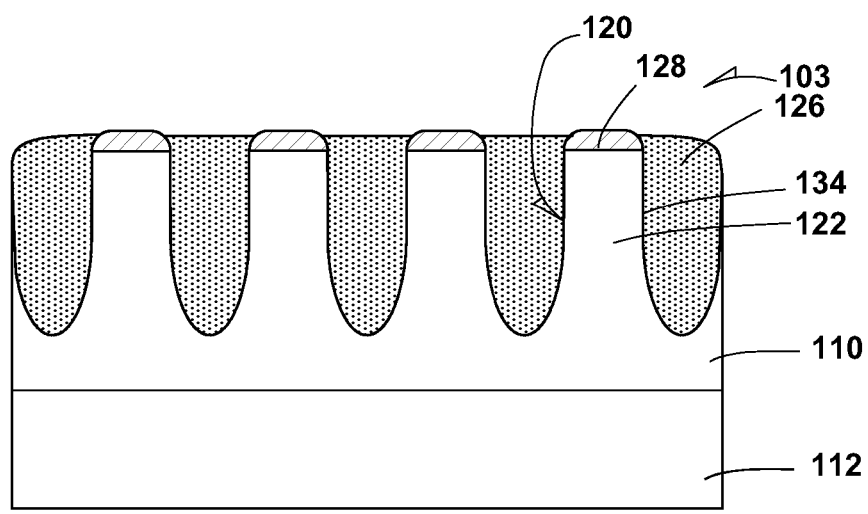
FIG. 1D illustrates the semiconductor device depicted in FIG. 1C during further processing according to an embodiment of the invention.

FIG. 1D illustrates the semiconductor device depicted in FIG. 1C during further processing according to an embodiment. The semiconductor device 103 has been processed to planarize the blanket dielectric 124 (FIG. 1C) to form a trench dielectric 126. Additionally, the patterned dielectric mask 118 (FIG. 1C) may be partially height-reduced to form a dielectric hard mask 128 during the planarizing process. The dielectric hard mask 128 can also be referred to as a first mask 128. In an embodiment, the planarizing process that is used to achieve the trench dielectric 126 and the dielectric hard mask 128 may include chemical-mechanical polishing (CMP). In an embodiment, the CMP process may include an etch-selective CMP recipe that stops on the dielectric hard mask 128. In an embodiment, the CMP process may include a timed CMP that stops on the dielectric hard mask 128. In an embodiment, a directional etch may be carried out that stops on the dielectric hard mask 128.

Figure 1E:
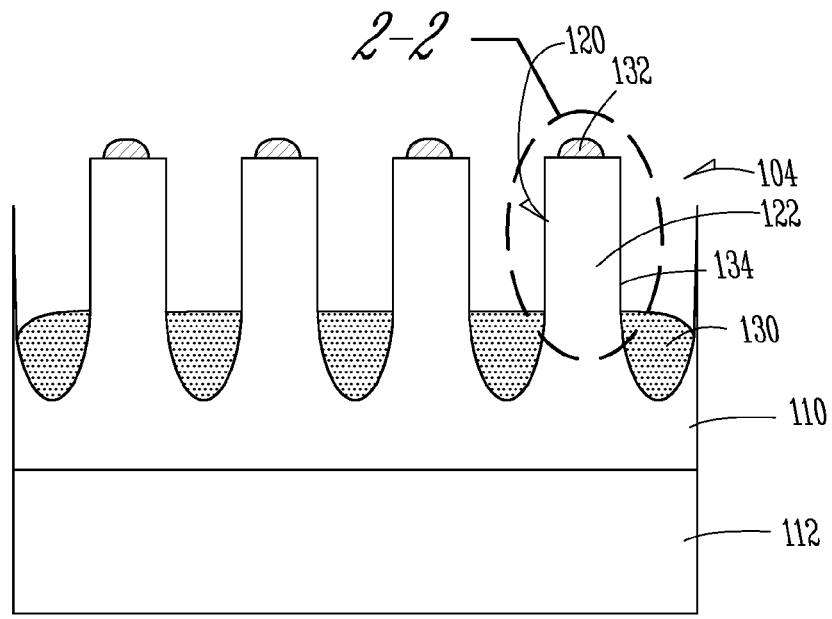
FIG. 1E illustrates the semiconductor device depicted in FIG. 1D during further processing according to an embodiment of the invention.

FIG. 1E illustrates the semiconductor device depicted in FIG. 1D during further processing according to an embodiment. In FIG. 1E, the semiconductor device 104 has been processed by a "first etch" to reduce the height of the trench dielectric 126 (FIG. 1D) to form a trench isolation dielectric 130. The trench isolation dielectric 130 can also be referred to as a trench isolation or a shallow-trench isolation (STI). Because this process delineates the "first etch" to achieve the trench isolation dielectric 130, the dielectric hard mask 128 may be referred to as a "first mask" 128. The result of the first etch may include exposing at least a portion of the sidewall 134 of the semiconductor fin 122.

In FIG. 1E, the first etch also achieves a laterally reduced dielectric hard mask 132, from the dielectric hard mask 128 (FIG. 1D). The laterally reduced dielectric hard mask 132 may be referred to as a "second mask" 132. In an embodiment, the first etch may include an etch recipe with a fluorocarbon etchant. In an embodiment, the flurocarbon etchant may include octofluoro butane ($C_4F_8$). In an embodiment, the flurocarbon etchant may include hexafluoro cyclobutene ($C_4F_6$). In an embodiment, two flurocarbon compounds may be used, and they may comprise $C_4F_8$ and $C_4F_6$.

In a first embodiment, the semiconductor structure 103 (FIG. 1D) is placed in an etch tool and subjected to a plasma etch with argon, helium, oxygen, octofluoro butane, and hexafluoro cyclobutene. In some embodiments, the etch process may be carried out within a pressure range from about 20 milliTorr to about 140 milliTorr.

In a second embodiment, the semiconductor structure 103 is subjected to a plasma etch with about 300 standard cubic centimeters per minute (sccm) argon, about 20 sccm helium with about 30% oxygen, about 11 sccm octafluoro butane, and about 4 sccm hexafluoro cyclobutene. In some embodiments, the etch process may be carried out in a reduced-pressure environment, such as below one atmosphere, including about 50 milliTorr.

In a third embodiment, the semiconductor structure 103 may be subjected to a plasma etch with about three parts octofluoro butane to about one part hexafluoro cyclobutene, at plasma conditions of about 1,350 Watts and about 2 MHz. In a fourth embodiment, the semiconductor structure 103 may be subjected to a plasma etch with about three parts octofluoro butane to about one part hexafluoro cyclobutene, at plasma conditions of about 900 Watts and about 27 MHz.

It has been observed that by decreasing the ratio of the hexafluoro cyclobutene to the octofluoro butane, the laterally reduced dielectric hard mask 132 is achieved. In a fifth embodiment, the semiconductor structure 103 is subjected to a plasma etch, which begins with about three parts octofluoro butane to about one part hexafluoro cyclobutene, and during the plasma etch, the ratio of octofluoro butane to hexafluoro cyclobutene is increased. In an embodiment, the ratio is increased by decreasing the flow of the hexafluoro cyclobutene. In an embodiment, the ratio is increased by increasing the flow of the octofluoro butane.

In an embodiment where residual polymer exists, e.g., from the photoresist mask 116 before the first etch, the amount of oxygen in the first etch may be increased momentarily to address removal of the residual polymer.

Figure 2:
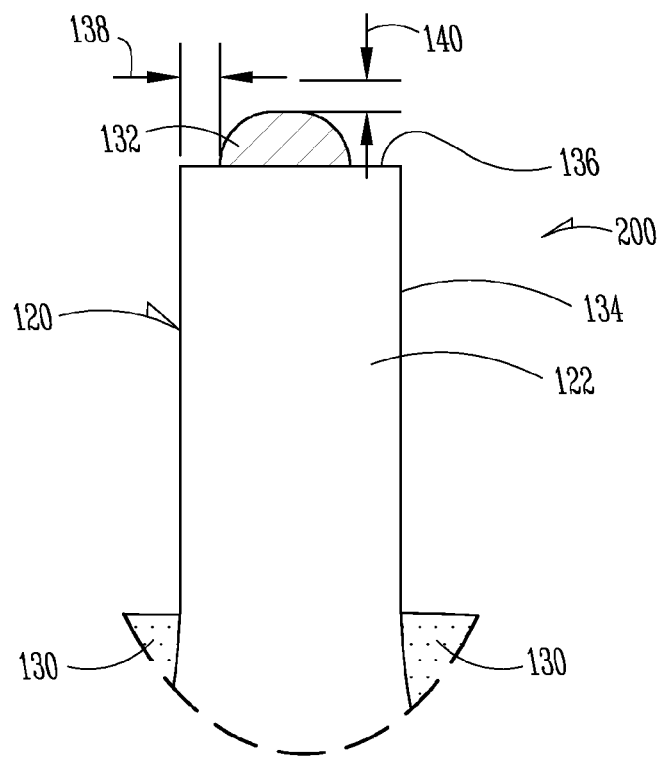
FIG. 2 is a detail section taken from FIG. 1D according to an embodiment of the invention.

FIG. 2 is a detail section 200 taken from FIG. 1D according to an embodiment. The section line 2 depicted in FIG. 1D illustrates the region taken from the semiconductor device 104. The semiconductor device 104 reveals the sidewall 134 of the semiconductor fin 122 and also a semiconductor fin top surface 136 because of lateral recession of the hard mask 132.

As depicted in FIG. 2, the hard mask 132 has receded from the sidewall 134 of the semiconductor fin 122 by a first amount 138, and has also been height reduced by a second amount 140. By use of first etch embodiments, it was observed that the first amount 138 is greater than the second amount 140.

Figure 1F:
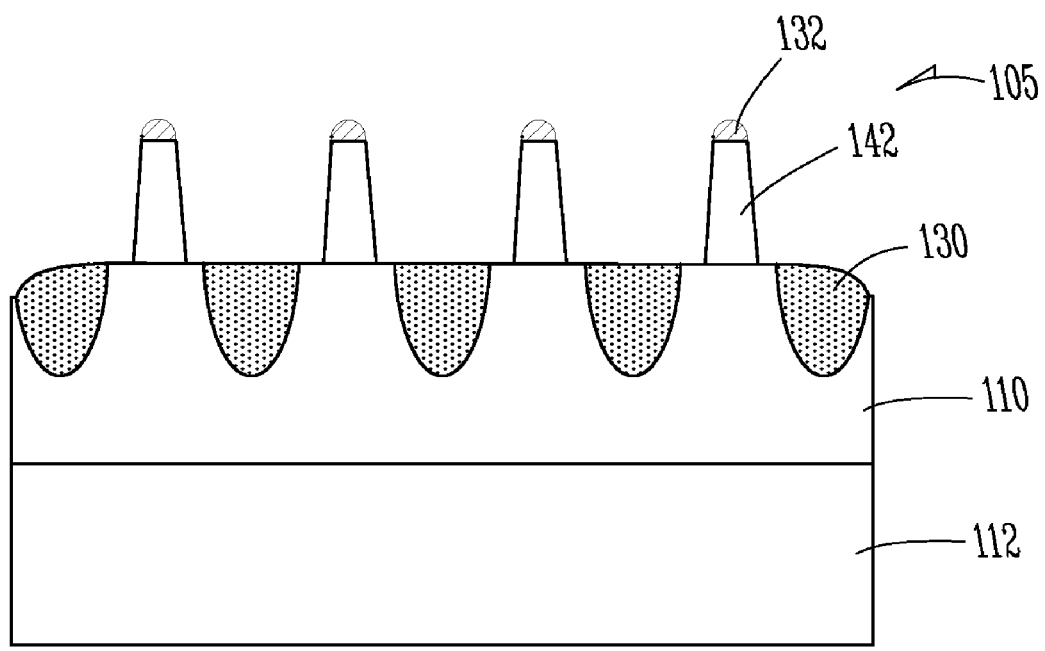
FIG. 1F illustrates the semiconductor device depicted in FIG. 1E during further processing according to an embodiment of the invention.

FIG. 1F illustrates the semiconductor device depicted in FIG. 1E during further processing according to an embodiment. In FIG. 1F, the semiconductor device 105 has been second etched such that the semiconductor fin 122 (FIG. 1E) has been further thinned to form a thinned semiconductor fin 142. In an embodiment, a directional dry etch is carried out that is timed and that is selective to leaving the STI 130.

Figure 3A:
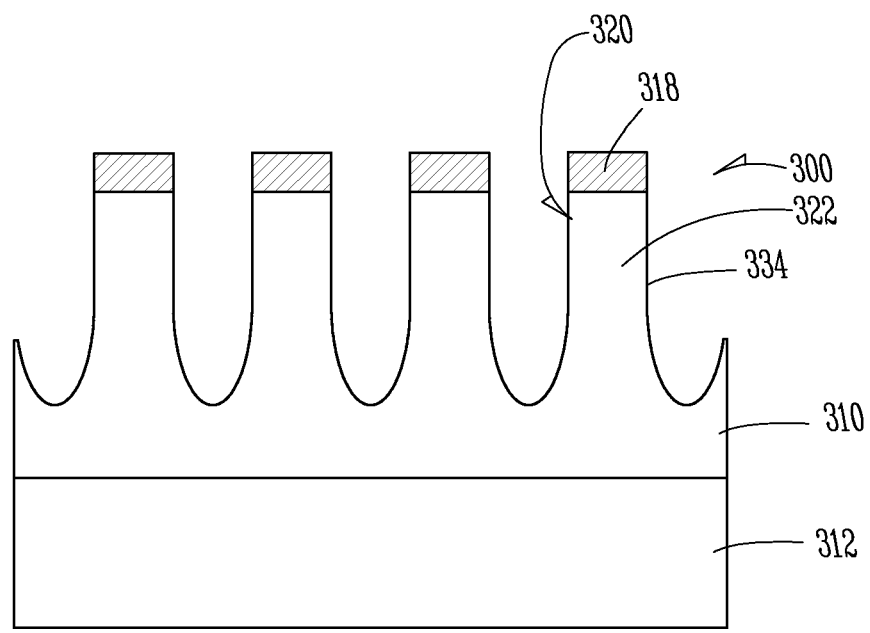
FIG. 3A is a cross-section elevation of a semiconductor device during processing according to an embodiment of the invention.

FIG. 3A is a cross-section elevation of a semiconductor device 300 during processing according to an embodiment. A semiconductive substrate 310 is a monocrystalline silicon such as wafer-level or epitaxial-level silicon. In an embodiment, the semiconductive substrate 310 is disposed upon an insulator 312 such as SOI.

The semiconductor device 300 exhibits a patterned dielectric mask 318 and a first recess 320 that defines a semiconductor fin 322 with a substantially vertical sidewall 334. In an embodiment, etching to define the semiconductor fin 322 with the substantially vertical sidewall 334 is carried out under conditions of a directional dry etch.

Figure 3B:
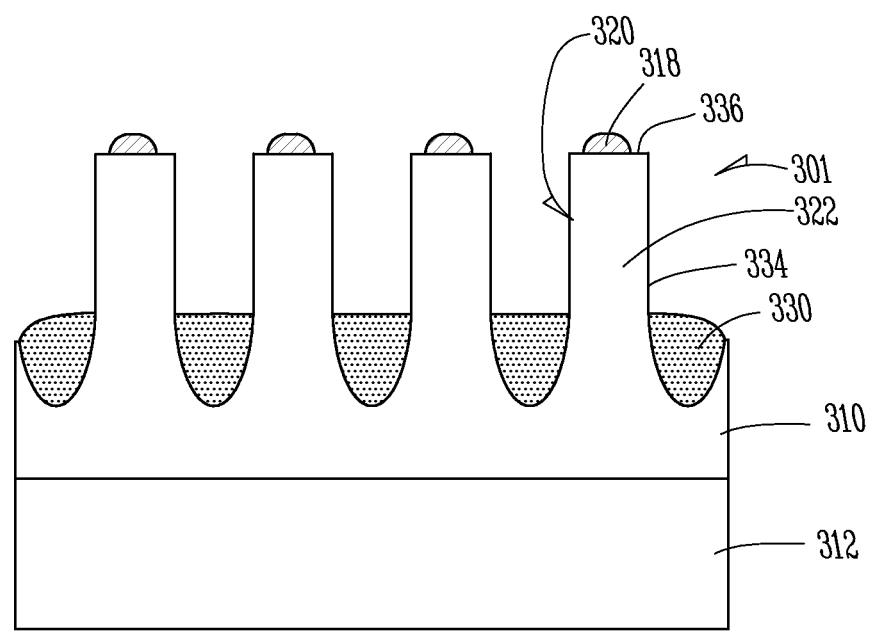
FIG. 3B illustrates the semiconductor device depicted in FIG. 3A during further processing according to an embodiment of the invention.

FIG. 3B illustrates the semiconductor device depicted in FIG. 3A during further processing according to an embodiment. The semiconductor device 301 has been processed with a blanket dielectric, followed by planarization of the blanket dielectric, and a "first etch" to reduce the height of the blanket dielectric to form a trench isolation dielectric 330, such as an STI 330. The result of the first etch includes exposing at least a portion of the sidewall 334 of the semiconductor fin 322. The first etch also achieves a laterally receded dielectric hard mask 332, from the dielectric hard mask 318 (FIG. 3A). The semiconductor device 301 reveals the sidewall 334 and also a semiconductor fin top surface 336 because of lateral recession of the hard mask 332. In an embodiment, the first etch may include an etch recipe with a fluorocarbon etchant, perhaps including octofluoro butane ($C_4F_8$) or hexafluoro cyclobutene ($C_4F_6$).

In a first embodiment, the semiconductor structure 301 may be placed in an etch tool and subjected to a plasma etch with argon, helium, oxygen, octafluoro butane, and hexafluoro cyclobutene. In some embodiments, the etch process may be carried out in a pressure range from about 20 milliTorr to about 140 milliTorr.

In an embodiment, the semiconductor structure 301 may be subjected to a plasma etch with about 300 sccm argon, about 20 sccm helium with about 30% oxygen, about 11 sccm octafluoro butane, and about 4 sccm hexafluoro cyclobutene. In some embodiments, the etch process may be carried out in a reduced-pressure environment, below one atmosphere. In some embodiments, the etch process may be carried out at about 50 milliTorr.

In a third embodiment, the semiconductor structure 301 may be subjected to a plasma etch with about three parts octafluoro butane to about one part hexafluoro cyclobutene, at plasma conditions of about 1,350 Watts and about 2 MHz. In a fourth example embodiment, the semiconductor structure 301 may be subjected to a plasma etch with about three parts octafluoro butane to about one part hexafluoro cyclobutene, at plasma conditions of about 900 Watts and about 27 MHz.

In an embodiment where residual polymer exists from the photoresist mask 318 before the first etch, the amount of oxygen in the first etch may be increased momentarily to address removal of the residual polymer.

Figure 3C:
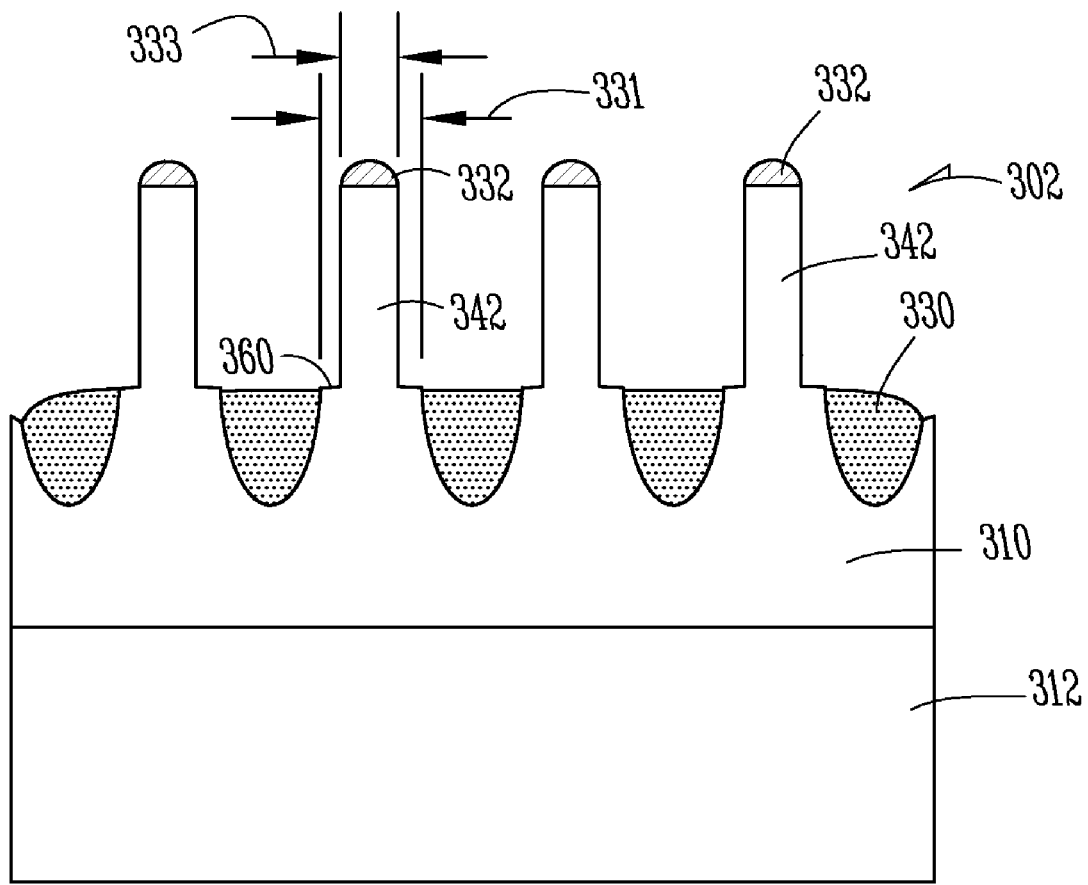
FIG. 3C illustrates the semiconductor device depicted in FIG. 3B during further processing according to an embodiment of the invention.

FIG. 3C illustrates the semiconductor device depicted in FIG. 3B during further processing according to an embodiment. The semiconductor device 302 has been second etched such that the semiconductor fin 322 (FIG. 3B) has been further thinned to form a thinned semiconductor fin 342 with a fin portion 342 and a base portion 360 that is thicker than the fin portion. In an embodiment, a directional dry etch is carried out that is timed and that is selective to leaving the STI 330. By using the laterally receded dielectric hard mask 332, the original minimum feature (F) 331, which can be at the limits of the photolithography used, is laterally reduced to achieve a new minimum feature (G) 333, which can be smaller than the limits of the photolithography process used. The ratio of G/F is also referred to as the thinned-portion thickness or first thickness, divided by the base-portion thickness or second thickness. In an embodiment, the minimum feature G 333 may be in a range from about 250 (Angstrom) (Å) to about 300 Å. In an embodiment, F is larger than G by about 9/1. In an embodiment, F may be larger than G by about 5/1. In an embodiment, F may be larger than G by about 3/1. In an embodiment, F may be larger than G by about 2/1. In an embodiment, F may be larger than G by about 3/2. In an embodiment, F is larger than G by about 4/3. Processing to obtain a given F/G ratio can be controlled by the fluorocarbon etch chemistry and other processing conditions, and by the aspect ratio (height 335, divided by G) for a given application.

Figure 3D:
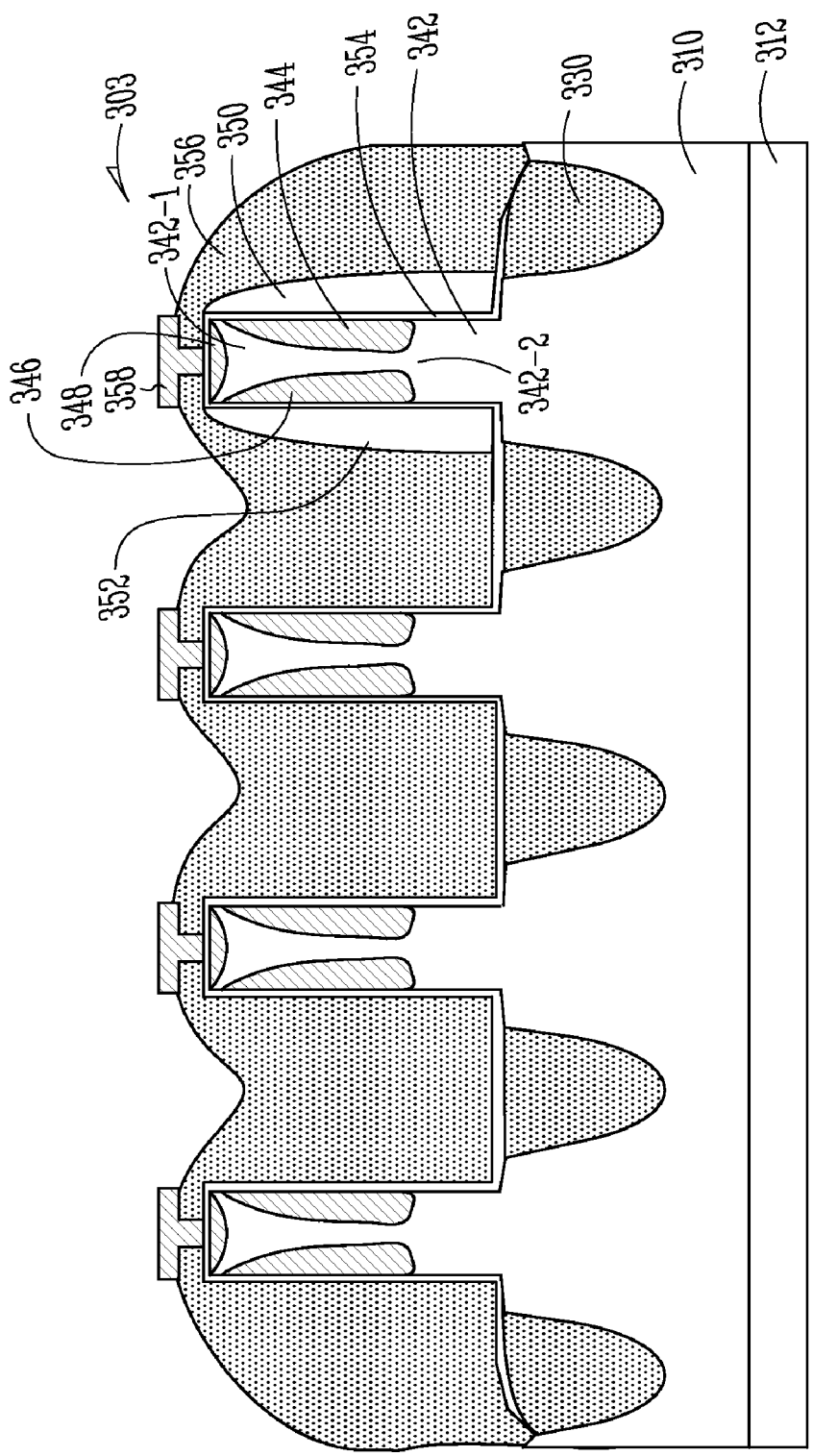
FIG. 3D illustrates the semiconductor device depicted in FIG. 3C during further processing according to an embodiment of the invention.

FIG. 3D illustrates the semiconductor device depicted in FIG. 3B during further processing according to an embodiment. The semiconductor device 303 has been further processed by implanting the thinned semiconductor fin 342 with a first gate doped region 344, a second gate doped region 346, and a third gate doped region 348, forming a first portion 342-1 and a base second portion 342-2. The semiconductor device 303 also has a first gate 350 and a second gate 352 formed over a gate oxide layer 354. The semiconductor device 303 also has a bulk dielectric layer 356 formed over the thinned semiconductor fin 342. The semiconductor device 303 also has a third gate 358 in the form of a plug and landing pad formed above the third gate doped region 348 of the thinned semiconductor fin 342. In an embodiment, the third gate 358 is also referred to as a top gate. In an embodiment, only one of the first or second gates 350 and 352 is present with the top gate 358. The semiconductor device 303 can also be referred to as a microelectronic device 303.

In any event, the semiconductor device 303 can be used as a transistor-bearing structure such as a flash memory device. In an embodiment, the semiconductor device 303 is a flash memory device based upon NAND logic.

Figure 4:
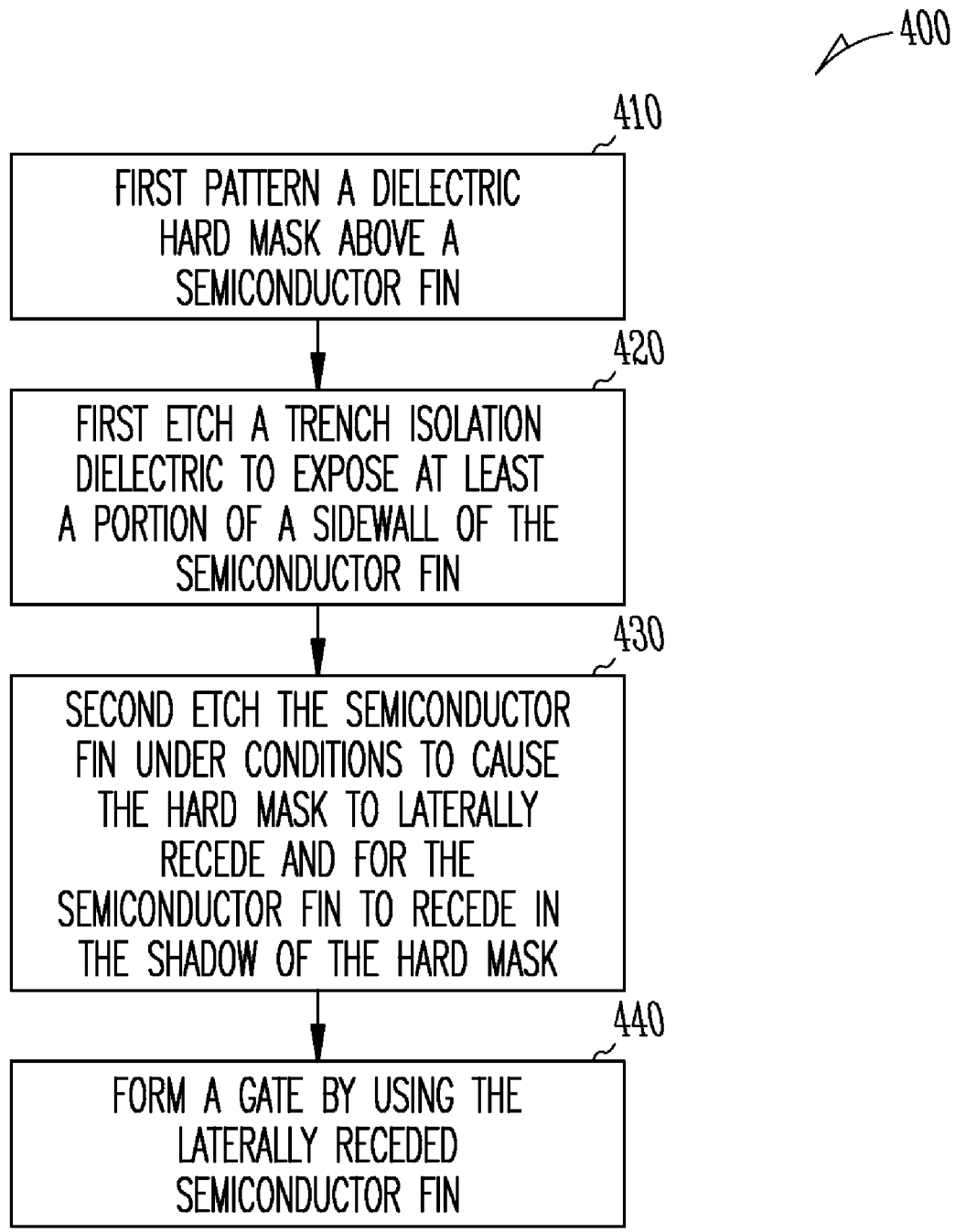
FIG. 4 is a flowchart of a method according to an embodiment of the invention.

FIG. 4 is a flowchart of a process 400 according to an embodiment. The process 400 includes the first etch and the second etch as set forth in this disclosure.

At 410, the process includes patterning a dielectric hard mask above a semiconductor fin. In a non-limiting example, the process includes achieving the patterned hard mask 118, followed by achieving the dielectric hard mask 128 as depicted in FIGS. 1B, 1C, and 1D.

At 420 the process includes a first etch of a trench dielectric to expose a sidewall of a semiconductor fin. In a non-limiting example, the trench dielectric 126 depicted in FIG. 1D is first etched to form the trench isolation dielectric 130, which also exposes the sidewall 134 of the semiconductor fin 122 as depicted in FIG. 1E. In an embodiment, the first etch is carried out under conditions to cause the dielectric hard mask 128 to recede more laterally than vertically to form a laterally receded hard mask 134. In an embodiment, any dual fluorocarbon etch set forth in this disclosure may be used.

At 430, the process includes second etching the semiconductor fin to cause it to recede in the shadow of the receded hard mask. In a non-limiting example, a directional dry etch is carried out that is timed and that is selective to leaving the STI 130, which has followed in the shadow of the receded hard mask 134 as depicted in FIG. 1F. In an embodiment, the process commences at 420 and terminates at 430.

At 440, the process includes forming a gate with the semiconductor fin. In a non-limiting example, the first gate 344 in FIG. 3D is formed with the first gate doped region 344 and the gate oxide layer 354 disposed therebetween.

FIGS. 5 through 10 illustrate other embodiments. The processes and structures that are achieved in the various embodiments are applicable to a variety of devices and apparatuses. The various disclosed semiconductor devices can be used as transistor-bearing structures such as flash memory devices. In an embodiment, systems incorporate at least one disclosed semiconductor device that is a flash memory device based upon NAND logic.

Specific systems can be made by process embodiments, or that include an embodiment or embodiments of the structures disclosed. For example, a chip package can contain a new minimum feature G semiconductor fin according to an embodiment. In another embodiment, the minimum feature G semiconductor fin is part of an electrical device that includes the semiconductor substrate in a chip package and the chip package is part of a memory module or part of a chipset. In another embodiment, the memory module is part of a DRAM module that is inserted into a host such as a motherboard or a digital computer. In another embodiment, specific systems can be made that include the minimum feature G semiconductor fin. For example, a chip package may contain a substrate such as one set forth in this disclosure. In another embodiment, the minimum feature G semiconductor fin is part of an electrical device that includes the semiconductor substrate in a chip package and the chip package is part of a memory module or part of a chipset. In another embodiment, the memory module is part of a flash DRAM module that is inserted into a host such as a motherboard or a digital computer. In another embodiment, the minimum feature G semiconductor fin is part of an electronic system. In another embodiment, the minimum feature G semiconductor fin is part of a flash memory device that in turn is part of a chipset such as a basic input-output system ("BIOS") for an electrical device.

Figure 5:
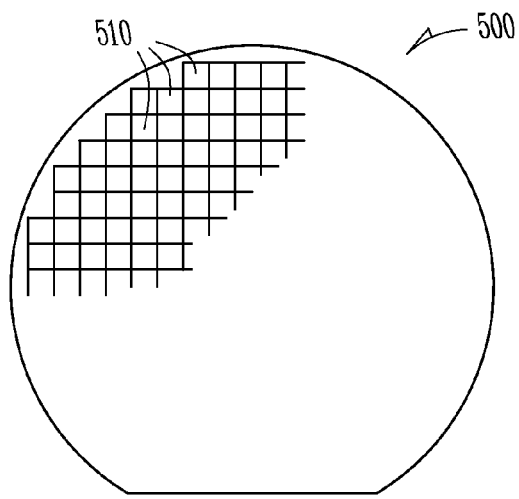
FIG. 5 is a top view of a wafer or substrate containing semiconductor dies according to an embodiment of the invention.

FIG. 5 is a top view of a wafer 500 or substrate containing semiconductor dice in accordance with an embodiment. With reference to FIG. 5, a semiconductor die 510 is produced from the silicon wafer 500 that contains at least one of the minimum feature G semiconductor fin structures such as are depicted in FIGS. 1 and 3. A die 510 is an individual pattern, typically rectangular, on a substrate such as substrate 112 (FIG. 1) or a substrate 212 (FIG. 2) or a substrate 312 (FIG. 3) that contains circuitry to perform a specific function. A semiconductor wafer 500 will typically contain a repeated pattern of such dice 510 containing the same functionality. The die 510 can further contain additional circuitry, perhaps including such complex devices as a monolithic processor with multiple functionality. The die 510 is typically packaged in a protective casing (not shown) with leads extending therefrom (not shown) providing access to the circuitry of the die 510 for unilateral or bilateral communication and control. In an embodiment, the die 510 may be incased in a host such as a chip package (not shown) such as a chip-scale package (CSP).

Figure 6:
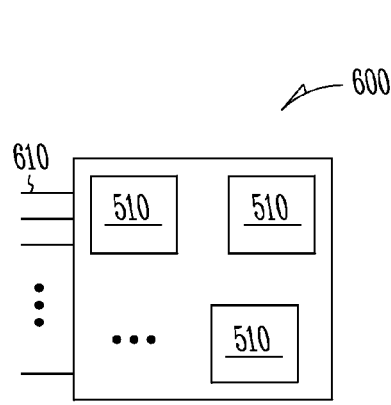
FIG. 6 is a block diagram of a circuit module according to an embodiment of the invention.

FIG. 6 is a block diagram of a circuit module 600 in accordance with an embodiment. As shown in FIG. 6, two or more dice 510 (at least one of which contains at least one of a minimum feature G semiconductor fin structure such as are depicted in FIGS. 1 and 3, respectively in accordance with various embodiments) may be combined, with or without protective casing, into a host such as a circuit module 600 to enhance or extend the functionality of an individual die 510. In an embodiment, the circuit module 600 may be a combination of dice 510 representing a variety of functions, or a combination of dice 510 containing the same functionality. Some examples of a circuit module 600 include memory modules, device drivers, power modules, communication modems, processor modules and application-specific modules and can include multi-layer, multi-chip modules. In an embodiment, the circuit module 600 may be a sub-component of a variety of electronic systems, such as a clock, a television, a cell phone, a personal computer, an automobile, an industrial control system, an aircraft, a hand-held device, and others. In an embodiment, the circuit module 600 may have a variety of leads 610 extending therefrom providing unilateral or bilateral communication and control.

Figure 7:
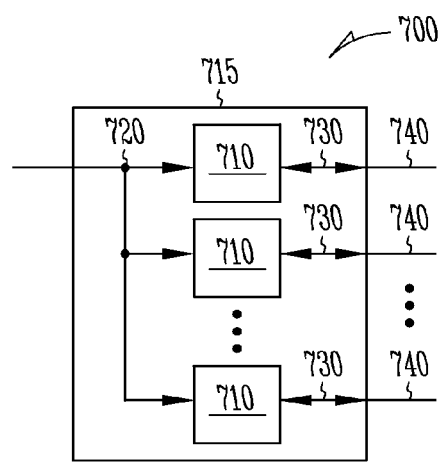
FIG. 7 is a block diagram of a memory module according to an embodiment.

FIG. 7 is a block diagram of a memory module 700 according to an embodiment. FIG. 7 shows one embodiment of a circuit module as a memory module 700 containing a minimum feature G semiconductor fin structure such as are depicted in FIGS. 1-3. The memory module 700 is a host that generally depicts a Single In-line Memory Module (SIMM) or Dual In-line Memory Module (DIMM). A SIMM or DIMM may generally comprise a printed circuit board ("PCB") or other support structure containing a series of memory devices. While a SIMM will have a single in-line set of contacts or leads, a DIMM will have a set of leads on each side of the support with each set representing separate I/O signals. The memory module 800 may include multiple memory devices 710 contained on a support 715, the number depending upon the desired bus width and the desire for parity. In an embodiment, the memory module 700 contains memory devices 710 on both sides of the support 715. In an embodiment, the memory module 700 accepts a command signal from an external controller (not shown) on a command link 720 and provides for data input and data output on data links 730. The command link 720 and data links 730 may be connected to leads 740 extending from the support 715. The leads 740 are shown for conceptual purposes and are not limited to the positions shown in FIG. 7.

Figure 8:
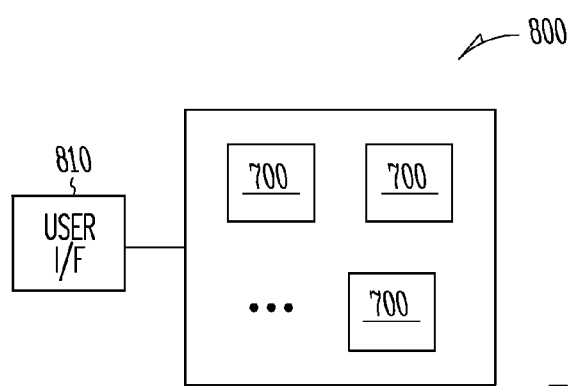
FIG. 8 is a block diagram of an electronic system according to an embodiment.

FIG. 8 is a block diagram of an electronic system 800 according to an embodiment. FIG. 8 shows another host type such as an electronic system 800 containing one or more circuit modules 600 as described above containing at least one of the minimum feature G semiconductor fin structure embodiments. The electronic system 800 generally contains a user interface 810. The user interface 810 provides a user of the electronic system 800 with some form of control or observation of the results of the electronic system 800. Some examples of the user interface 810 include the keyboard, pointing device, monitor and printer of a personal computer; the tuning dial, display and speakers of a radio; the ignition switch of gas pedal of an automobile; and the card reader, keypad, display and currency dispenser of an automated teller machine. The user interface 810 can further describe access ports provided to the electronic system 800. Access ports are used to connect an electronic system to the more tangible user interface components previously exemplified. One or more of the circuit modules 700 can be a processor providing some form of manipulation, control or direction of inputs from or outputs to the user interface 810, or of other information either preprogrammed into, or otherwise provided to, the electronic system 800. As will be apparent from the lists of examples previously given, the electronic system 800 will often contain certain mechanical components (not shown) in addition to the circuit modules 700 and the user interface 810. It will be appreciated that the one or more circuit modules 700 in the electronic system 800 can be replaced by a single integrated circuit. Furthermore, the electronic system 800 may be a sub-component of a larger electronic system.

Figure 9:
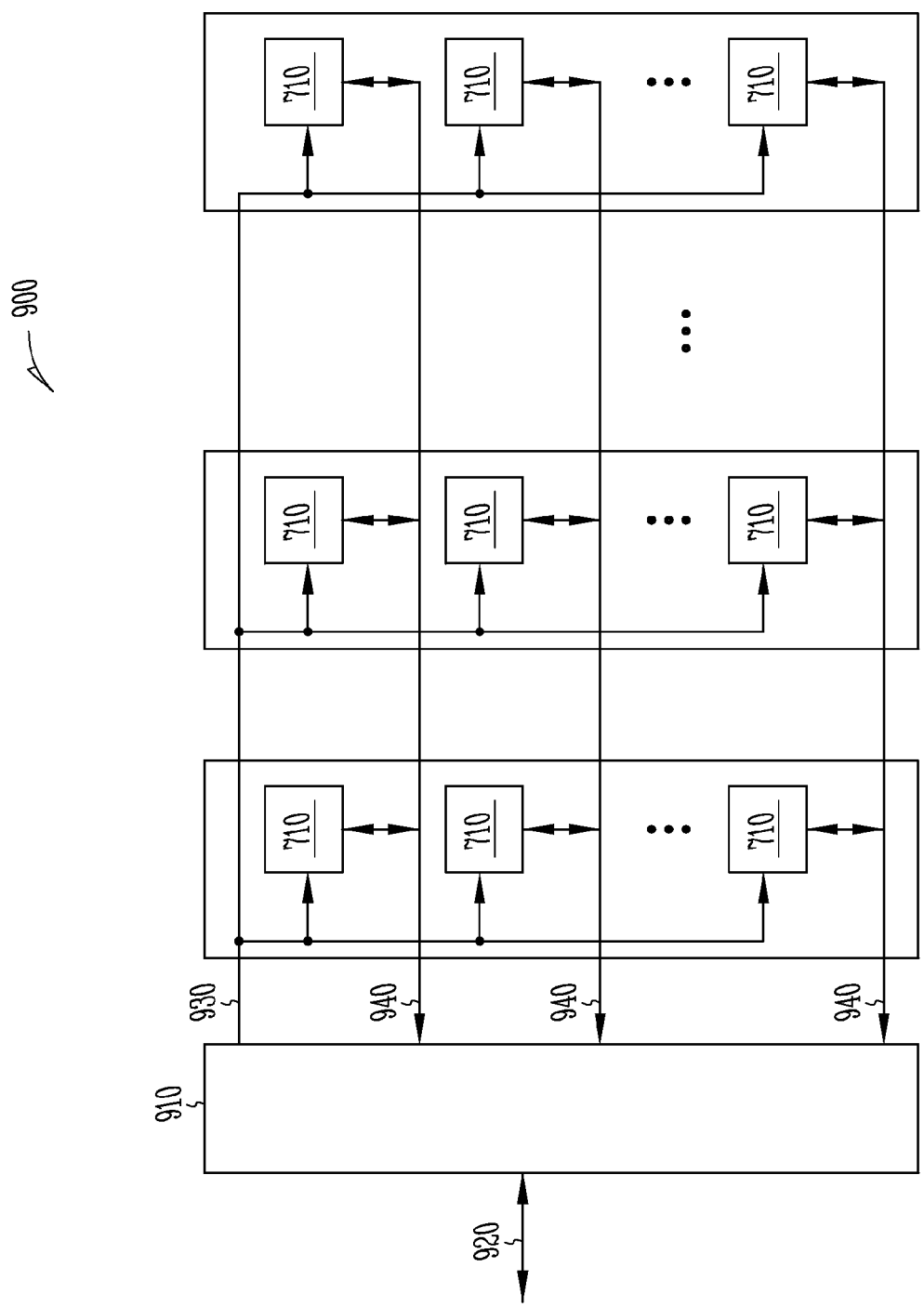
FIG. 9 is a block diagram of a memory system according to an embodiment.

FIG. 9 is a block diagram of a memory system 900 according to an embodiment. FIG. 9 shows an embodiment of an electrical device at a system level. The memory system 900 acts as a higher-level host that contains one or more memory devices 710 as described above including at least one of the minimum feature G semiconductor fin structure embodiments, and a memory controller 910 that can also include circuitry that is connected with a buried digit line structure as set forth herein. The memory controller 910 provides and controls a bidirectional interface between the memory system 900 and an external system bus 920. The memory system 900 accepts a command signal from the external system bus 920 and relays it to the one or more memory devices 710 on a command link 930. The memory system 900 provides for data input and data output between the one or more memory devices 710 and the external system bus 920 on data links 940.

Figure 10:
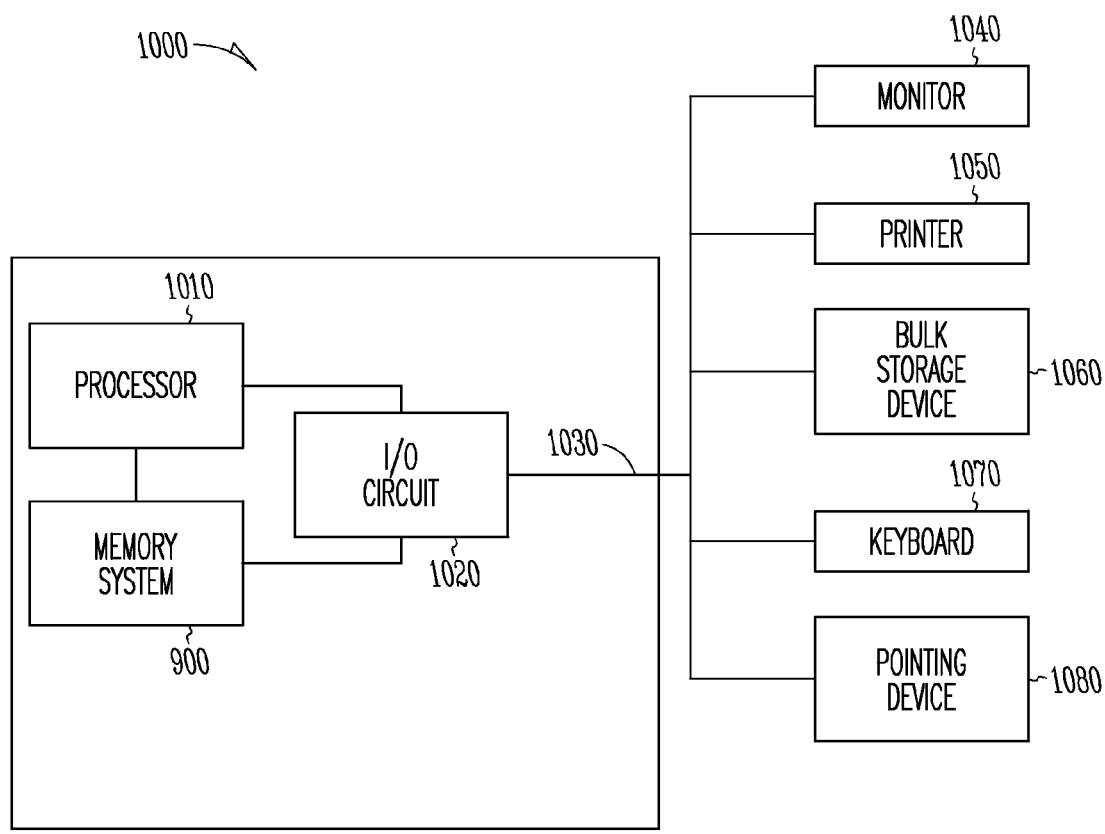
FIG. 10 is a block diagram of an electronic system, including a computer system 1000, according to an embodiment of the invention.

FIG. 10 is a block diagram of an electronic system, including a computer system 1000, according to an embodiment. The computer system 1000 contains a processor 1010 and a memory system 900 housed in a computer unit 1015. The computer system 1000 is but one example of an electronic system containing another electronic system, i.e. the memory system 900, as a sub-component. In an embodiment, the computer system 1000 contains an input/output (I/O) circuit 1020 that is coupled to the processor 1010 and the memory system 900. In an embodiment, the computer system 1000 contains user interface components that are coupled to the I/O circuit 1020. In an embodiment, a plurality of minimum feature G semiconductor fin structures is coupled to one of a plurality of I/O pads or pins 1030 of the I/O circuit 1020. The I/O circuit 1020 can be coupled to one or more of a monitor 1040, a printer 1050, a bulk storage device 1060, a keyboard 1070 and a pointing device 1080. It will be appreciated that other components are often associated with the computer system 1000 such as modems, device driver cards, and additional storage devices, etc. It will further be appreciated that the processor 1010, the memory system 900, the I/O circuit 1020 and partially isolated structures or data storage devices of computer system 1000 can be incorporated on a single integrated circuit. Such single package processing units reduce the communication time between the processor 1010 and the memory system 1000.

This Detailed Description refers to the accompanying drawings that show, by way of illustration, specific aspects and embodiments in which the present disclosure may be practiced. These embodiments are described in sufficient detail to enable those skilled in the art to practice the disclosed embodiments. Other embodiments may be utilized and structural, logical, and electrical changes may be made without departing from the scope of the present disclosure. The various embodiments are not necessarily mutually exclusive, as some embodiments can be combined with one or more other embodiments to form new embodiments.

The term "horizontal" as used in this document is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The Detailed Description is, therefore, not to be taken in a limiting sense, and the scope of this disclosure is defined only by the appended claims, along with the full scope of equivalents to which such claims are entitled.

The Abstract is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. An article comprising:
   a semiconductor fin including:
      a first portion extending from a base portion, the first portion having a first thickness and the base portion having a second thickness, the second thickness being larger than the first thickness;
      a first doped region disposed adjacent and in contact with the first portion, the first doped region disposed above the base portion;
   a dielectric on the semiconductor fin;
   a first gate disposed on the dielectric adjacent to the first portion and adjacent to the base portion; and
   a top gate disposed adjacent to a top surface of the semiconductor fin separated from the semiconductor fin by the dielectric, the top gate separated from the first gate by the dielectric and by a bulk dielectric region disposed over and contacting the first gate.

2. The article of claim 1, wherein the semiconductor fin extends from a semiconductive substrate such that a sidewall of the semiconductor fin is substantially perpendicular.

3. The article of claim 1, wherein the semiconductor fin extends from a semiconductive substrate such that a sidewall of the semiconductor fin is substantially non-perpendicular.

4. The article of claim 1, wherein the article includes a second gate disposed on the dielectric adjacent to the first portion and adjacent to the base portion, the second gate opposite the first gate.

5. The article of claim 1, wherein the article includes a top doped region disposed adjacent and in contact with the first portion, the top doped region separated from the top gate by the dielectric.

6. An article comprising:
   a semiconductor fin including:
      a first portion extending from a base portion, the first portion having a first thickness and the base portion having a second thickness, the second thickness being larger than the first thickness;
      a first doped region disposed adjacent and in contact with the first portion, the first doped region disposed above the base portion;
   a dielectric on the semiconductor fin;
   a first gate disposed on the dielectric adjacent to the first portion and adjacent to the base portion; and
   a top gate configured as a plug and landing pad above a second doped region disposed in the semiconductor fin above the first portion.

7. The article of claim 1, wherein the first portion has a thickness in a range from about 250 Å to about 300 Å.

8. An electronic device comprising:
   a substrate;
   a semiconductor fin disposed on the substrate, the semiconductor fin including:
      a first portion extending from a base portion, the first portion having a first thickness and the base portion having a second thickness, the second thickness being larger than the first thickness;
      a first doped region disposed adjacent and in contact with the first portion, the first doped region disposed above the base portion;
      a second doped region disposed adjacent and in contact with the first portion, the second doped region disposed above the base portion, the first doped region separated from the second doped region by the first portion;
      a third doped region disposed above and in contact with the first portion;
   a dielectric on the semiconductor fin; and
   a gate disposed on the dielectric adjacent to the first portion; and
   a top gate disposed adjacent to a top surface of the semiconductor fin separated from the semiconductor fin by the dielectric, the top gate separated from the gate by the dielectric and by a bulk dielectric region disposed over and contacting the gate.

9. The electronic device of claim 8, wherein the dielectric is an oxide.

10. The electronic device of claim 8, wherein the gate is adjacent to the first doped region and separated from the first doped region by the dielectric, and the electronic device includes a second gate adjacent to the second doped region, the second gate separated from the second doped region by the dielectric, the top gate separated from the third doped region by the dielectric.

11. The electronic device of claim 8, wherein the substrate includes monocrystalline silicon.

12. The electronic device of claim 8, wherein the substrate includes a silicon-on-insulator structure.

13. The electronic device of claim 8, wherein the first thickness varies along the first portion from base portion to a top of the first portion.

14. A wafer comprising:
   a plurality of dice, each die of the plurality of dice including:
      a semiconductor fin including:

a first portion extending from a base portion, the first portion having a first thickness and the base portion having a second thickness, the second thickness being larger than the first thickness;

a first doped region disposed adjacent and in contact with the first portion, the first doped region disposed above the base portion;

a dielectric on the semiconductor fin;

a first gate disposed on the dielectric adjacent to the first portion and adjacent to the base portion; and a top gate disposed adjacent to a top surface of the semiconductor fin separated from the semiconductor fin by the dielectric, the top gate separated from the first gate by the dielectric and by a bulk dielectric region disposed over and contacting the first gate.

15. The wafer of claim 14, wherein each die includes a flash memory device.

16. The wafer of claim 15, wherein the flash memory device is based on NAND logic.

17. The wafer of claim 14, wherein each die includes a processor.

18. The wafer of claim 14, wherein the wafer includes a silicon wafer.

19. The wafer of claim 14, wherein each die includes a second gate disposed on the dielectric adjacent to the first portion and adjacent to the base portion, the second gate opposite the first gate.

20. The wafer of claim 19, wherein the top gate is separated from the second gate by the dielectric and by the bulk dielectric region disposed over and contacting the second gate.

* * * * *